(12) United States Patent
Chen

(10) Patent No.: US 10,311,817 B2
(45) Date of Patent: Jun. 4, 2019

(54) DISPLAY DEVICE AND DISPLAY METHOD

(71) Applicant: SHENZHEN CHINA STAR OPTOELECTRONICS TECHNOLOGY CO., LTD., Guangdong (CN)

(72) Inventor: Shuai Chen, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/740,006

(22) PCT Filed: Aug. 9, 2017

(86) PCT No.: PCT/CN2017/096537
§ 371 (c)(1),
(2) Date: Dec. 27, 2017

(87) PCT Pub. No.: WO2018/223518
PCT Pub. Date: Dec. 13, 2018

(65) Prior Publication Data
US 2018/0374440 A1 Dec. 27, 2018

(30) Foreign Application Priority Data
Jun. 9, 2017 (CN) .......................... 2017 1 0433606

(51) Int. Cl.
G06F 3/041 (2006.01)
G09G 3/36 (2006.01)
H01L 27/12 (2006.01)

(52) U.S. Cl.
CPC ......... *G09G 3/3674* (2013.01); *G09G 3/3685* (2013.01); *H01L 27/1214* (2013.01); *G09G 2310/0264* (2013.01)

(58) Field of Classification Search
CPC ............... G09G 3/3674; G09G 3/3685; G09G 2310/0264; H01L 27/1214
See application file for complete search history.

(56) References Cited

U.S. PATENT DOCUMENTS

2009/0160879 A1* 6/2009 Tu .............................. G09G 3/20
345/690
2012/0092316 A1* 4/2012 He ....................... G09G 3/3614
345/209

* cited by examiner

Primary Examiner — Nelson M Rosario
(74) Attorney, Agent, or Firm — Mark M. Friedman

(57) ABSTRACT

A display device and a display method using the display device are provided. The display device includes a display panel and a driving circuit. The display panel includes a first number of pixel rows, a second number of scanning lines, and the first number of data lines. The driving circuit includes a scanning driver and a data driver. The data driver utilizes partial pixel rows reversed way during a predetermined timing circle to drive the display panel via data driving signals for displaying images frame by frame. The present disclosure may decrease power consumption of the display device.

18 Claims, 5 Drawing Sheets

FIG. 2

DISPLAY DEVICE AND DISPLAY METHOD

FIELD OF THE INVENTION

The present disclosure relates to the field of display technique, and more particularly to a display device and a display method using the display device.

BACKGROUND OF THE INVENTION

The conventional display device generally utilizes row-reversed driving way to display images. In the conventional row-reversed driving way, two adjacent pixel rows of the display device have reversed polarities.

For example, the display device has N pixel rows (N is an even number), then in each frame of image, the number of pixel rows having positive polarity is N/2 and the number of pixel rows having negative polarity is also N/2.

However, the row-reversed driving way as mentioned above exists a power consumption problem, i.e., the conventional row-reversed driving way causes the display device to have relatively high power consumption.

Therefore, it is needed to provide a new display device and method to overcome the problem existed in the conventional technology.

SUMMARY OF THE INVENTION

An object of the present disclosure is to provide a display device and the method thereof for decreasing power consumption.

To achieve the above object, the present disclosure provides the following techniques:

A display device, wherein the display device comprises: a display panel, wherein the display panel comprises: a first number of pixel rows, wherein each one of the pixel rows comprises a second number of pixel units, and the first number is an odd number; a second number of scanning lines, wherein each one of the scanning lines is connected with a corresponding pixel unit of the first number of pixel rows; a first number of data lines, wherein the data lines are connected with the pixel units of each of the pixel rows; a driving circuit, wherein the driving circuit comprises: a scanning driver, wherein the scanning driver is connected with the second number of scanning lines, and the scanning driver generates scanning driving signals which are sent to the pixel units via the scanning lines; a data driver, wherein the data driver is connected with the first number of data lines, the data driver generates data driving signals which are sent to the pixel rows via the data lines, wherein during a predetermined timing circle, the data driver is configured to utilize a partial pixel rows reversed way for driving the display panel via the data driving signals, such that images are displayed frame by frame; wherein a portion of the pixel rows have a same polarity in adjacent frames of images on timeline; wherein the partial pixel rows reversed way means that a portion of the pixel rows have polarity reversed in adjacent frames on timeline, and a rest of the pixel rows on the same adjacent frames on timeline keep the polarity unchanged.

The display device as mentioned, wherein a number of frames of the image corresponding to the predetermined timing circle is defined as a third number; wherein the data driver is configured to equalize a total number of pixel rows having positive polarity to a total number of pixel rows having negative polarity using the data driving signals in the third number of the frames of the images.

The display device as mentioned, wherein in any one frame of the images during the predetermined timing circle, a number of pixel rows having positive polarity is defined as a fourth number, and a number of pixel rows having negative polarity is defined as a fifth number; the fourth number is greater or equal to zero, and the fourth number is less than or equal to a sixth number plus one; the fifth number is greater or equal to the sixth number, and the fifth number is less than or equal to the first number; the first number is equal to the fourth number plus the fifth number; the third number is equal to the first number multiplied by 2 and plus 4; the sixth number is equal to the first number minus 1 then divided by 2; and the fourth number and the fifth number are defined as integers.

The display device as mentioned, wherein during the predetermined timing circle, the data scanning driver generates a seventh number of normal frames of images, an auxiliary frame of image, and two compensation frames of images; wherein the seventh number is equal to the third number minus 3; wherein in the normal frames of images, the fourth number is equal to the sixth number plus 1, and the fifth number is equal to the sixth number; wherein in the auxiliary frame of image, the fourth number is equal to the sixth number, and the fifth number is equal to the sixth number plus 1; and wherein in the compensation frames of images, the fourth number is equal to zero, and the fifth number is equal to the first number.

A display device, wherein the display device comprises: a display panel, wherein the display panel comprises: a first number of pixel rows, wherein each one of the pixel rows comprises a second number of pixel units, and the first number is an odd number; a second number of scanning lines, wherein each scanning line is connected with a corresponding pixel unit of the first number of pixel rows; a first number of data lines, wherein the data lines are connected with the pixel units of each of the pixel rows; a driving circuit, wherein the driving circuit comprises: a scanning driver, wherein the scanning driver is connected with the second number of scanning lines, and the scanning driver generates scanning driving signals which are continually sent to the pixel units via the scanning lines; a data driver, wherein the data driver is connected with the first number of data lines, the data driver generates data driving signals which are sent to the pixel rows via the data lines, wherein during a predetermined timing circle, the data driver is configured to utilize a partial pixel rows reversed way for driving the display panel via the data driving signals, such that images are displayed frame by frame.

The display device as mentioned, wherein a portion of the pixel rows have a same polarity in adjacent frames of images on timeline.

The display device as mentioned, wherein the partial pixel rows reversed way means that a portion of the pixel rows have polarity reversed in adjacent frames on timeline, and a rest of the pixel rows on the same adjacent frames on timeline keep the polarity unchanged.

The display device as mentioned, wherein a number of frames of the image corresponding to the predetermined timing circle is defined as a third number; wherein the data driver is configured to equalize a total number of pixel rows having positive polarity to a total number of pixel rows having negative polarity using the data driving signals in the third number of the frames of the images.

The display device as mentioned, wherein in any one frame of the images during the predetermined timing circle, a number of pixel rows having positive polarity is defined as a fourth number, and a number of pixel rows having negative polarity is defined as a fifth number; the fourth number is greater or equal to zero, and the fourth number is less than or equal to a sixth number plus one; the fifth number is greater or equal to the sixth number, and the fifth number is less than or equal to the first number; the first number is equal to the fourth number plus the fifth number; the third number is equal to the first number multiplied by 2 and plus 4; the sixth number is equal to the first number minus 1 then divided by 2; and the fourth number and the fifth number are defined as integers.

The display device as mentioned, wherein during the predetermined timing circle, the data scanning driver generates a seventh number of normal frames of images, an auxiliary frame of image, and two compensation frames of images; wherein the seventh number is equal to the third number minus 3; wherein in the normal frames of images, the fourth number is equal to the sixth number plus 1, and the fifth number is equal to the sixth number; wherein in the auxiliary frame of image, the fourth number is equal to the sixth number, and the fifth number is equal to the sixth number plus 1; and wherein in the compensation frames of images, the fourth number is equal to zero, and the fifth number is equal to the first number.

The display device as mentioned, wherein the auxiliary frame of image is set in the seventh number of normal frames of images, the two compensation frames of images are set after the seventh number of normal frames of images, and the two compensation frames of images are adjacent to each other on timeline.

The display device as mentioned, wherein the normal frames of images are provided to the display panel for displaying.

A display method using the display device as mentioned, wherein the display method comprises the following steps: A. generating, by the scanning driver, scanning driving signals and sending the scanning driving signals to the pixel units via the scanning lines; B. generating, by the data driver, data driving signals and sending the data driving signals to the pixel rows via the data lines, wherein during a predetermined timing circle, the data driver is configured to utilize a partial pixel rows reversed way for driving the display panel via the data driving signals, such that images are displayed frame by frame.

The display method of the display device as mentioned, wherein a portion of the pixel rows have a same polarity in adjacent frames of images on timeline.

The display method of the display device as mentioned, wherein the partial pixel rows reversed way means that a portion of the pixel rows have polarity reversed in adjacent frames on timeline, and a rest of the pixel rows on the same adjacent frames on timeline keep the polarity unchanged.

The display device as mentioned, wherein a number of frames of the image corresponding to the predetermined timing circle is defined as a third number; wherein the data driver is configured to equalize a total number of pixel rows having positive polarity to a total number of pixel rows having negative polarity using the data driving signals in the third number of the frames of the images.

The display method of the display device as mentioned, wherein in any one frame of the images during the predetermined timing circle, a number of pixel rows having positive polarity is defined as a fourth number, and a number of pixel rows having negative polarity is defined as a fifth number; the fourth number is greater or equal to zero, and the fourth number is less than or equal to a sixth number plus one; the fifth number is greater or equal to the sixth number, and the fifth number is less than or equal to the first number; the first number is equal to the fourth number plus the fifth number; the third number is equal to the first number multiplied by 2 and plus 4; the sixth number is equal to the first number minus 1 then divided by 2; and the fourth number and the fifth number are defined as integers.

The display method of the display device as mentioned, wherein during the predetermined timing circle, the data scanning driver generates a seventh number of normal frames of images, an auxiliary frame of image, and two compensation frames of images; wherein the seventh number is equal to the third number minus 3; wherein in the normal frames of images, the fourth number is equal to the sixth number plus 1, and the fifth number is equal to the sixth number; wherein in the auxiliary frame of image, the fourth number is equal to the sixth number, and the fifth number is equal to the sixth number plus 1; and wherein in the compensation frames of images, the fourth number is equal to zero, and the fifth number is equal to the first number.

The display method of the display device as mentioned, wherein the auxiliary frame of image is set in the seventh number of normal frames of images, the two compensation frames of images are set after the seventh number of normal frames of images, and the two compensation frames of images are adjacent to each other on timeline.

The display method of the display device as mentioned, wherein the normal frames of images are provided to the display panel for displaying.

Compared to the conventional technique, the present disclosure provides the display device and the display method in such a way that in any normal frame of image or auxiliary frame of image, the number of pixels having positive polarity shown in the display panel is not equal to the number of pixels having negative polarity shown in the display panel, therefore In the display panel, a portion of the pixel rows have polarity reversed in adjacent frames on timeline, while the other pixel rows in the same adjacent frames on timeline keep the polarity unchanged thereby promoting the design flexibility of the display panel driving way thus decreasing the power consumption.

For more clearly and easily understanding above content of the present disclosure, the following text will take a preferred embodiment of the present disclosure with reference to the accompanying drawings for detailed description as follows.

DESCRIPTION OF THE DRAWINGS

FIG. 2 is a schematic diagram of the display device of the present disclosure having three rows of pixels showing the corresponding polarity of each row of pixels in each sequential frame of image during a predetermined timing circle.

DETAILED DESCRIPTION OF THE PREFERRED EMBODIMENTS

The embodiments described herein, with reference to the accompanying drawings, are explanatory, illustrative, and used to generally understand the present disclosure. Furthermore, the noun "a" as mentioned in the disclosure including the claims is interpreted as "one or more", unless it is otherwise particularly defined or it may be understood from the context as the particular singular form.

Figure 1:
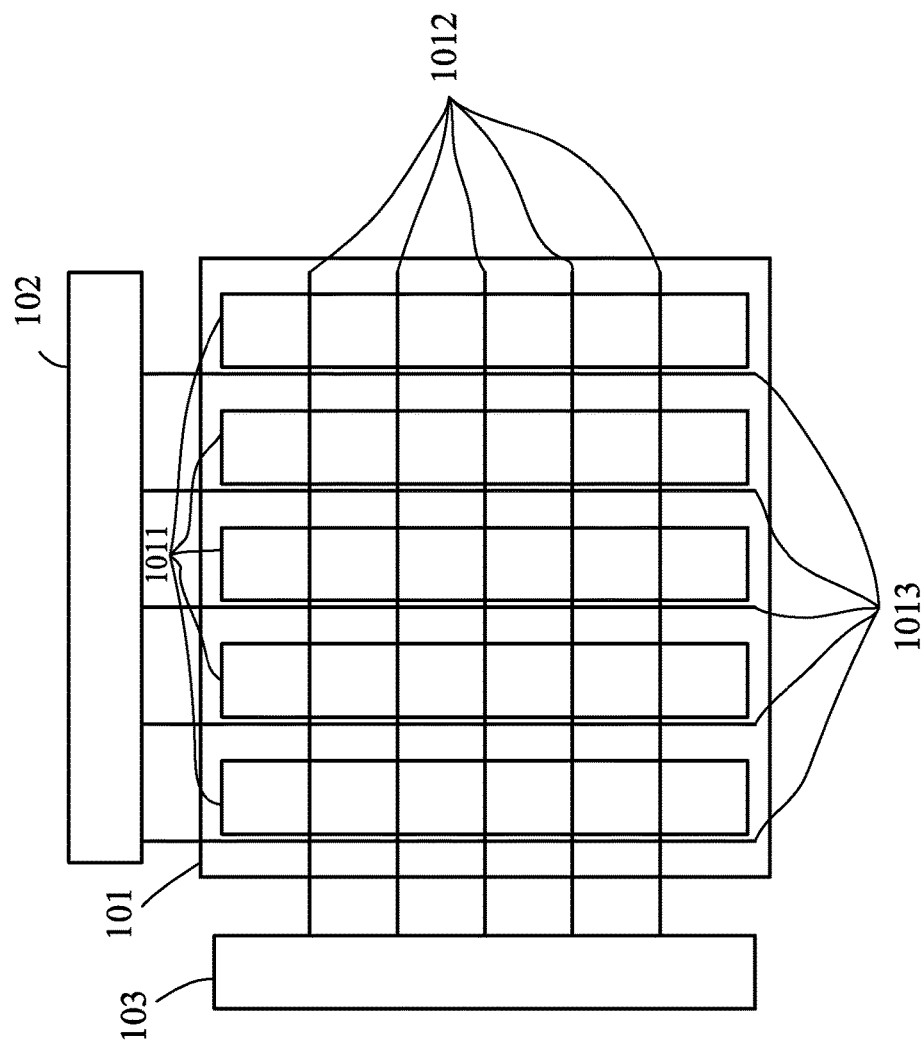
FIG. 1 is a schematic diagram of the display device of the present disclosure.

Referring to FIG. 1, a schematic diagram of the display device of the present disclosure is shown.

The display device of the present disclosure comprises a display panel 101 and a driving circuit. The driving circuit is connected to the display panel 101. The display panel 101 may be TFT-LCD (Thin Film Transistor Liquid Crystal Display) or OLED (Organic Light Emitting Diode).

The display panel 101 comprises a first number of pixel rows 1011, a second number of scanning lines 1012, and the first number of data lines 1013.

Each one of the pixel rows 1011 comprises a second number of pixel units. The first number is an odd number.

Each one of the scanning lines 1012 is connected with one of the pixel units of the first number of pixel rows 1011.

Each one of the data lines 1013 is connected with all the pixel units of of a corresponding one of the pixel rows 1011.

The driving circuit comprises a scanning driver 103 and a data driver 102.

The scanning driver 103 is connected with the second number of scanning lines 1012. The scanning driver 103 generates scanning signals and sends the generated scanning signals to the pixel units 1011 via the scanning lines 1012.

The data driver 102 is connected with the first number of data lines 1013. The data driver 102 generates data driving signals which are sent to the pixel rows 1011 via the data lines 1013, and the data driver 102 during a predetermined timing circle on timeline utilizes partial pixel rows reversed way to drive the display panel 101 via the data driving signals to display images frame by frame.

A portion of the pixel rows 1011 have the same polarity in adjacent frames of images on timeline.

During the predetermined timing circle, the data driver 102 sends corresponding data driving signals frame by frame to the first number of pixel rows 1011 in each frame via the first number of data lines 1013.

Utilizing partial pixel rows reversed way to drive the display panel 101 represents that a portion of the pixel rows 1011 have polarity reversed in adjacent frames on timeline, and a rest of the pixel rows 1011 in the same adjacent frames on timeline keep the polarity unchanged.

Figure 2:
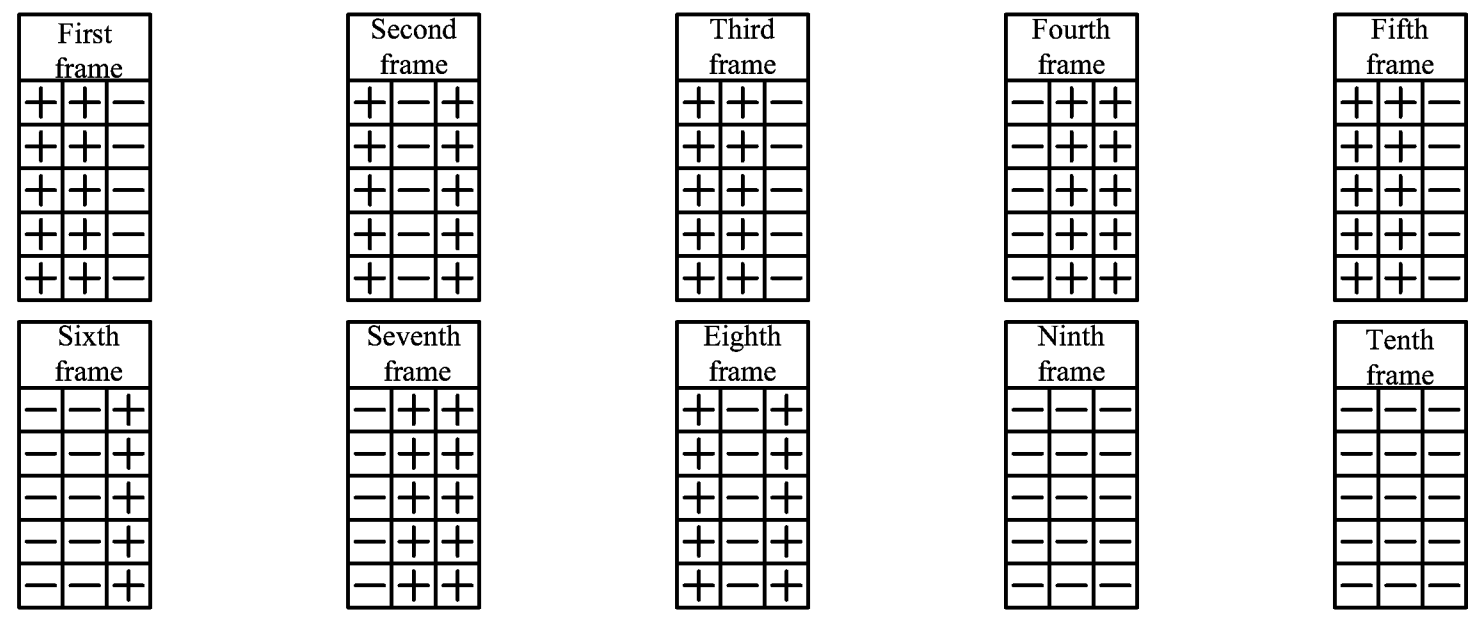

For example, referring to FIG. 2, the first frame of image and the second frame of image are two frames of images on timeline. The first pixel row in the first frame of image is positive polarity (+). The first pixel row in the second frame of image is also positive polarity (+). The second pixel row in the first frame of image is positive polarity (+). The second pixel row in the second frame of image is negative polarity (−). The third pixel row in the first frame of image is negative polarity (−). The third pixel row in the second frame of image is positive polarity (+). The second pixel row and the third pixel row are polarity reversed in the first frame of image and in the second frame of image. The first pixel row keeps polarity unchanged in the first frame of image and in the second frame of image.

Figure 3:
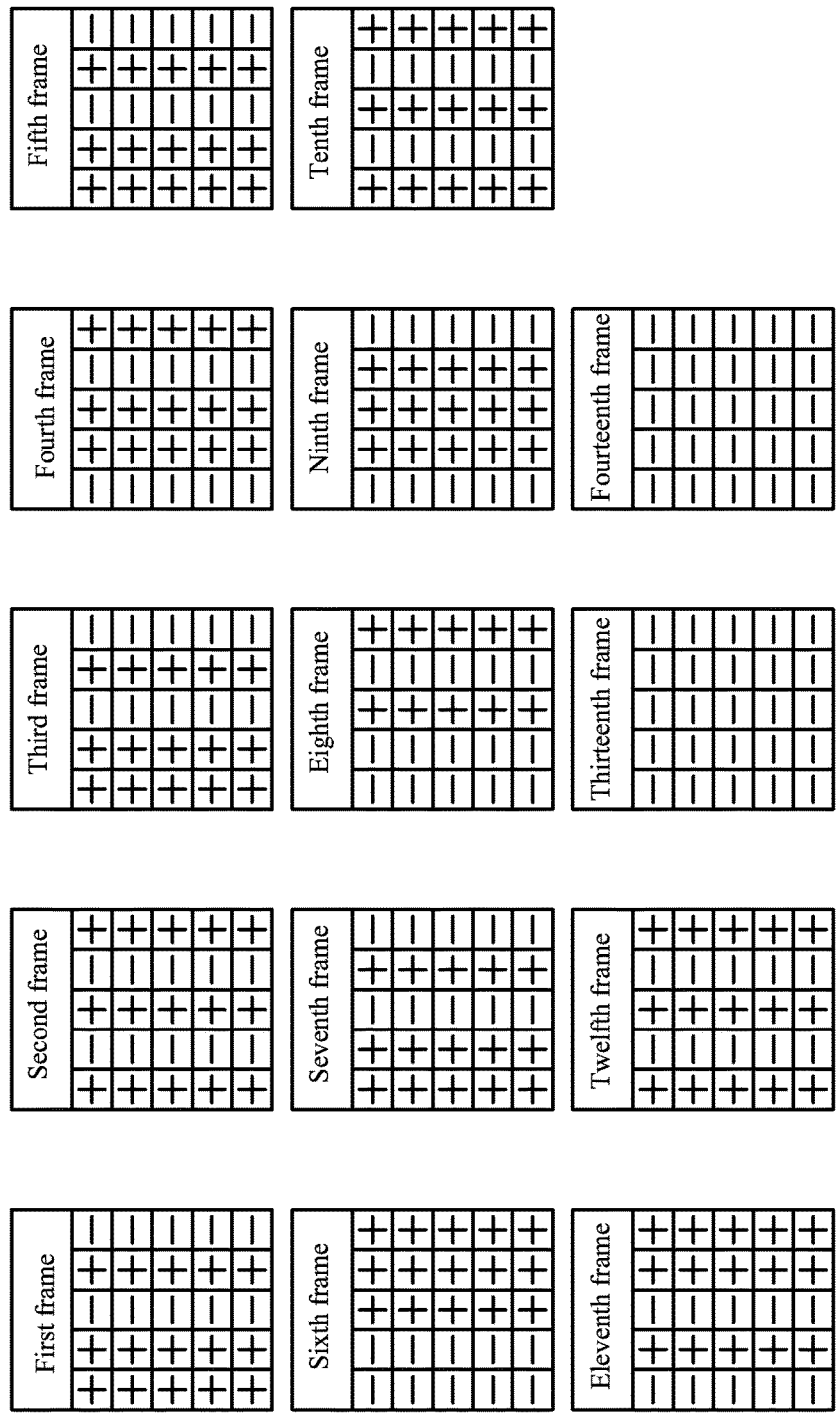
FIG. 3 is a schematic diagram of the display device of the present disclosure having five rows of pixels showing the corresponding polarity of each row of pixels in each sequential frame of image during a predetermined timing circle.

Referring to FIG. 3, the second frame of image and the third frame of image are two adjacent frames of images on timeline. Be noted that "frame of image" is also written as "image frame" for simplification hereinafter. The first pixel row, the second pixel row, the third pixel row, the fourth pixel row, and the fifth pixel row in the second image frame are respectively positive polarity, negative polarity, positive polarity, negative polarity, and positive polarity. The first pixel row, the second pixel row, the third pixel row, the fourth pixel row, and the fifth pixel row in the third frame of image are respectively positive polarity, positive polarity, negative polarity, positive polarity, and negative polarity. The second pixel row, the third pixel row, the fourth pixel row, and the fifth pixel row in the second frame of image and in the third frame of image are respectively polarity reversed. The first pixel row in the second frame of image and in the third frame of image keeps polarity unchanged.

Figure 4:
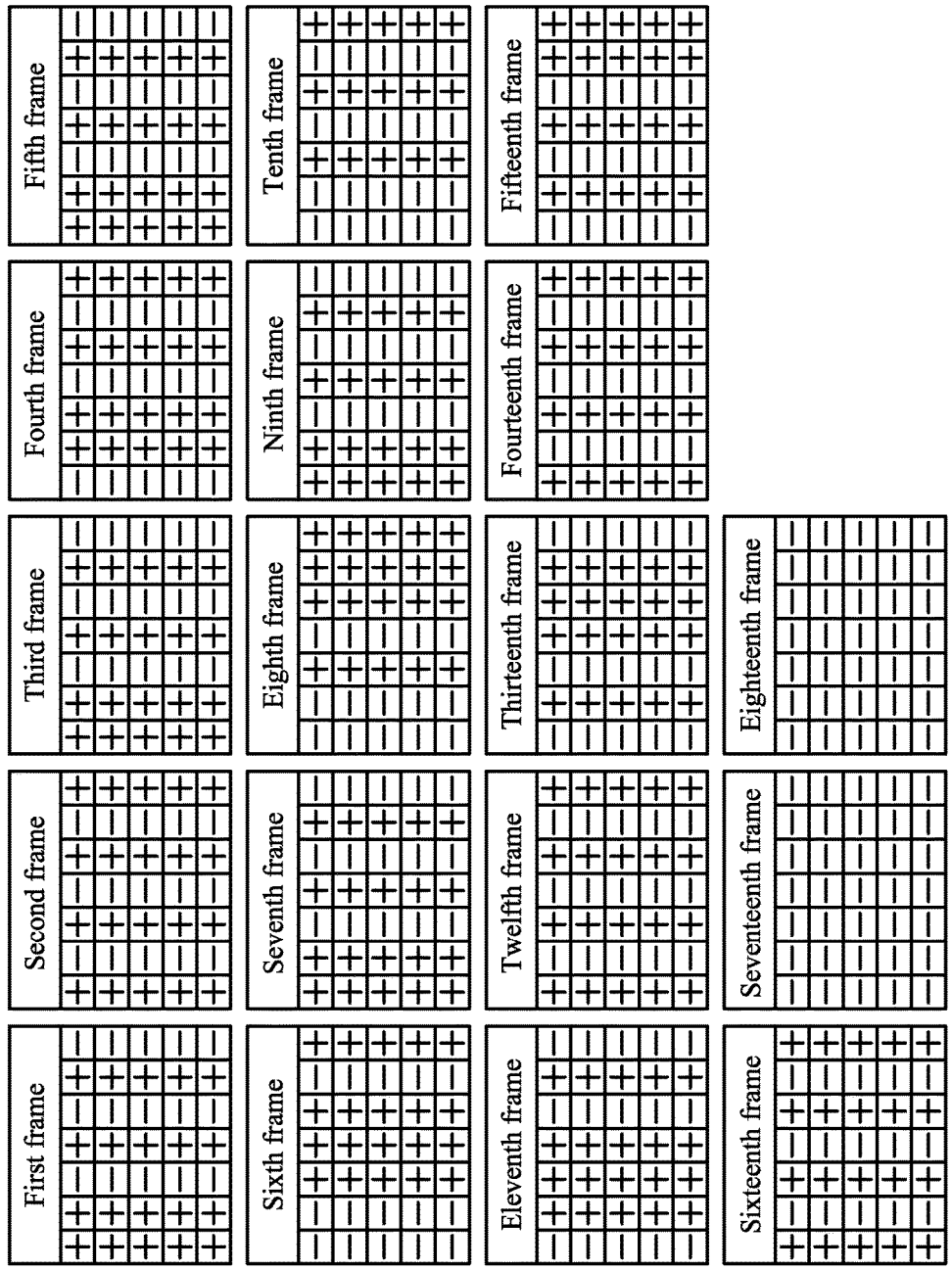
FIG. 4 is a schematic diagram of the display device of the present disclosure having seven rows of pixels showing the corresponding polarity of each row of pixels in each sequential frame of image during a predetermined timing circle.

Referring to FIG. 4, the third frame of image and the fourth frame of image are two adjacent frames of images on timeline. The first pixel row, the second pixel row, the third pixel row, the fourth pixel row, the fifth pixel row, the sixth pixel row, and the seventh pixel row in the third frame of image are respectively positive polarity, positive polarity, negative polarity, positive polarity, negative polarity, positive polarity, and negative polarity. The first pixel row, the second pixel row, the third pixel row, the fourth pixel row, the fifth pixel row, the sixth pixel row, and the seventh pixel row in the fourth frame of image are respectively negative polarity, positive polarity, positive polarity, negative polarity, positive polarity, negative polarity, and positive polarity. The first pixel row, the third pixel row, the fourth pixel row, the fifth pixel row, the sixth pixel, and the seventh pixel row in the third frame of image and in the fourth frame of image are respectively polarity reversed. The second pixel row in the third frame of image and in the fourth frame of image keeps polarity unchanged.

During the predetermined timing circle, the total number of image frames is defined as a third number.

The data driver 102 makes by the data driving signals the number of the pixel rows 1011 having positive polarity equal to the number of the pixel rows 1011 having negative polarity in (or during) the third number of image frames.

For example, in FIG. 2, the number of the pixel rows 1011 having positive polarity is 15 equal to the number of the pixel rows 1011 having negative polarity.

For example, in FIG. 3, the number of the pixel rows 1011 having positive polarity is 35 equal to the number of the pixel rows 1011 having negative polarity.

For example, in FIG. 4, the number of the pixel rows 1011 having positive polarity is 63 equal to the number of the pixel rows 1011 having negative polarity.

In any image frame during the predetermined timing circle, the number of pixel rows having positive polarity is a fourth number, and the number of pixel rows having negative polarity is a fifth number.

The fourth number is greater or equal to 0, and it is less than or equal to the sixth number plus 1.

The fifth number is greater than or equal to the sixth number, and the fifth number is less than or equal to the first number.

The first number=the fourth number+the fifth number.

The third number=the first number×2+4.

The sixth number=(the first number−1)/2.

The fourth number and the fifth number are integers.

For example, in FIG. 2, the first number is 3, the sixth number is 1, and the third number 10. The predetermined timing circle is the displaying time period of the corresponding 10 image frames.

Referring to FIG. 3, the first number is 5, then the sixth number is 2, and the third number is 14. The predetermined timing circle is the displaying time period of the corresponding 14 image frames.

Referring to FIG. 4, the first number is 7, the sixth number is 3, and the third number is 18. The predetermined timing circle is the displaying time period of the corresponding 18 image frames.

During the predetermined timing circle, the data driver 102 generates the seventh number of normal image frames (herein the term "image frames" is same as "frames of images"), an auxiliary image frame, and two compensation image frames.

The seventh number=the third number−3.

In the normal image frames: the fourth number=the sixth number+1; the fifth number=the sixth number.

In the auxiliary image frame: the fourth number=the sixth number; the fifth number=the sixth number+1.

In the compensation image frames: the fourth number=0; the fifth number=1.

The auxiliary image frame is set on timeline in the seventh number of normal image frames, while the two compensation image frames are set on timeline after the seventh number of image frames. The two compensation image frames are adjacent to each other on timeline.

The normal image frames are provided to the display panel 101 for displaying.

For example, in FIG. 2, the third number is 10, and the seventh number is 7. The first image frame, the second image frame, the third image frame, the fourth image frame, the fifth image frame, the seventh image frame, and the eighth image frame are normal image frames. The sixth image frame is an auxiliary image frame. The ninth image frame and the tenth image frame are compensation image frames. In FIG. 2, the display panel 101 has three pixel rows 1011 shown thereon, wherein the first image frame, the second image frame, the third image frame, the fourth image frame, the fifth image frame, the seventh image frame, and the eighth image frame meet the requirements: "the fourth number=the sixth number+1, the fifth number=the sixth number." The sixth image frame is an auxiliary image frame. The ninth image frame and the tenth image frame are compensation image frames. During each predetermined timing circle, each pixel row 1011 experiences half circle positive polarity driving voltage in half of the image frames and half circle negative polarity driving voltage in the other half of the image frames. Wherein the half circle positive polarity driving voltage means the pixel row 1011 experiences in half of the predetermined timing circle the positive polarity driving voltage. The half circle negative polarity driving voltage means the pixel row 1011 experiences in half of the predetermined timing circle the negative polarity driving voltage.

In FIG. 3, the first image frame, the second image frame, the third image frame, the fourth image frame, the fifth image frame, the sixth image frame, the seventh image frame, the ninth image frame, the tenth image frame, the eleventh image frame, and the twelfth image frame are normal image frames. The eighth image frame is the auxiliary image frame. The thirteenth image frame and the fourteenth image frame are compensation image frames. In FIG. 3, the display panel 101 has five pixel rows 1011 shown thereon, wherein the first image frame, the second image frame, the third image frame, the fourth image frame, the fifth image frame, the sixth image frame, the seventh image frame, the ninth image frame, the tenth image frame, the eleventh image frame, and the twelfth image frame meet the requirements: "the fourth number=the sixth number+1, the fifth number=the sixth number." The eighth image frame is an auxiliary image frame. The thirteenth image frame and the fourteenth image frame are compensation image frames.

During each predetermined timing circle, each pixel row 1011 experiences half circle positive polarity driving voltage in half of the image frames and half circle negative polarity driving voltage in the other half of the image frames.

In FIG. 4, the first image frame, the second image frame, the third image frame, the fourth image frame, the fifth image frame, the sixth image frame, the seventh image frame, the eighth image frame, the ninth image frame, the eleventh image frame, the twelfth image frame, the thirteenth image frame, the fourteenth image frame, the fifteenth image frame and the sixteenth image frame are normal image frames. The tenth image frame is the auxiliary image frame. The seventeenth image frame and the eighteenth image frame are compensation image frames. In FIG. 4, the display panel 101 has seven pixel rows 1011 shown thereon, wherein the first to the ninth (1-9) image frames and the eleventh to sixteenth (11-16) image frames meet the requirements: "the fourth number=the sixth number+1, the fifth number=the sixth number." The tenth image frame is an auxiliary image frame. The seventeenth image frame and the eighteenth image frame are compensation image frames. During each predetermined timing circle, each pixel row 1011 experiences half circle positive polarity driving voltage in half of the image frames and half circle negative polarity driving voltage in the other half of the image frames.

During each predetermined timing circle, the number of the auxiliary image frames and the number of the compensation image frames corresponding to the total number of the image frames have the following ratio as shown in TABLE 1.

TABLE 1 ratio of (number of the auxiliary image frame and number of the compensation image frames) to the total number of image frames:

| | number of pixel rows | | | |
|---|---|---|---|---|
| | 3 | 5 | 7 | 2 × sixth number + 1 |
| Ratio of (auxiliary image frame and compensation image frames) to the total image frames | 30% | 21.4% | 16.67% | 3/(4 × sixth number + 6) |

Figure 5:
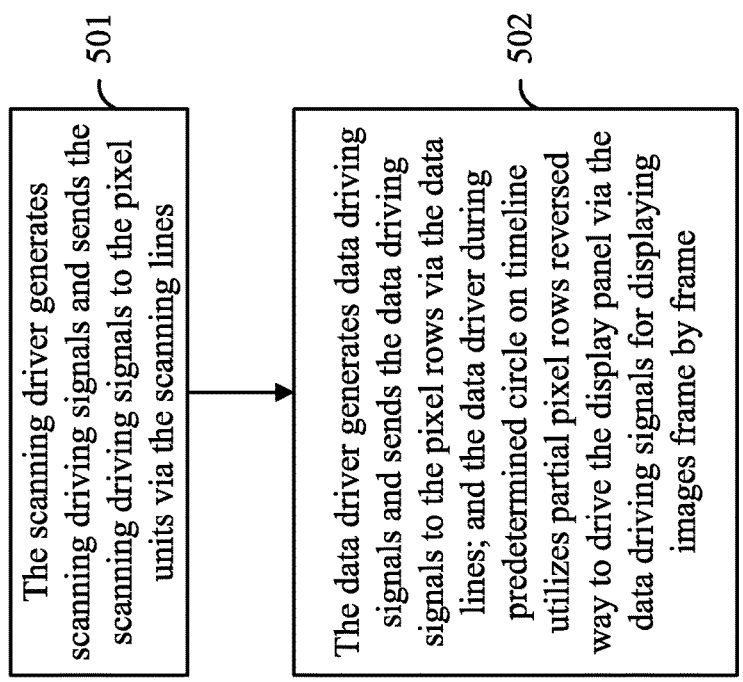
FIG. 5 is a schematic diagram showing a display method using the display device of the present disclosure.

Referring to FIG. 5, a schematic diagram of a display method using the display device of the present disclosure is shown.

The display method using the display device of the present disclosure comprises the following steps:

A. The scanning driver 103 generates scanning driving signals and sends the scanning driving signals to the pixel units via the scanning lines 1012.

B. The data driver 102 generates data driving signals and sends the data driving signals to the pixel rows 1011 via the data lines 1013. The data driver 102 during the predetermined timing circle utilizes partial pixel rows reversed way to drive the display panel 101 via the data driving signals for displaying images frame by frame.

A portion of the pixel rows 1011 have the same polarity in adjacent frames of images on timeline.

During the predetermined timing circle, the data driver 102 sends the corresponding data driving signals via the first number of data lines 1013 to the first number of pixel rows 1011 frame by frame on timeline.

Utilizing the partial pixel rows reversed way to drive the display panel represents that a portion of the pixel rows 1011 in the display panel 101 have polarity reversed in adjacent frames on timeline, while the other pixel rows in the same adjacent frames on timeline keep the polarity unchanged.

The total number of image frames corresponding to the predetermined timing circle on timeline is a third number.

During the third number of image frames on timeline, the data driving signals generated by the data driver 102 are used to make the total number of pixel rows having positive polarity equal to the total number of pixel rows having negative polarity.

In any one image frame during the predetermined timing circle on timeline, the number of pixel rows 1011 having positive polarity is a fourth number, while the number of pixel rows 1011 having negative polarity is a fifth number.

The fourth number is greater than or equal to zero, and the fourth number is less than or equal to a sixth number plus one.

The fifth number is greater than or equal to the sixth number, and the fifth number is less than or equal to the first number.

The first number is equal to the fourth number plus the fifth number.

The third number is equal to the first number multiplied by 2 and plus 4.

The sixth number is equal to the first number minus 1 then divided by 2.

The fourth number and the fifth number are integers.

During the predetermined timing circle on timeline, the data driving signals generated by the data driver 102 are used to generate a seventh number of normal image frames, an auxiliary image frame, and two compensation image frames.

The seventh number=the third number−3.

In the normal frames of images, the fourth number=the sixth number+1, the fifth number=the sixth number.

In the auxiliary image frame, the fourth number=the sixth number, the fifth number=the sixth number+1.

In the compensation image frames, the fourth number is equal to zero, the fifth number is equal to the first number.

The auxiliary image frame is set on timeline in the seventh number of normal image frames, the two compensation image frames are set on timeline after the seventh number of normal image frames. The two compensation image frames are adjacent to each other on timeline.

The normal image frames are provided to the display panel 101 for displaying.

The display device and the display method of the present disclosure generates two adjacent image frames on timeline, wherein a portion of the pixel rows 1011 in the two adjacent image frames have the same polarity thus decreasing the power consumption of the display device.

Additionally, during each predetermined timing circle, each pixel row experiences the same times of positive polarity driving voltage and negative polarity driving voltage thus guaranteeing the movable ions in the liquid crystal molecules not to be left in either polarity plate of the liquid crystal capacitor.

In any normal frame of image (frame of image also named image frame) or auxiliary frame of image, the number of pixel rows 1011 having positive polarity shown in the display panel 101 is not equal to the number of pixel rows 1011 having negative polarity shown in the display panel 101, therefore In the display panel 101, a portion of the pixel rows 1011 have polarity reversed in adjacent frames on timeline, while the other pixel rows 1011 in the same adjacent frames on timeline keep the polarity unchanged thereby promoting the design flexibility of the display panel driving way thus decreasing the power consumption. Additionally, in the predetermined timing circle on timeline, the total number of pixel rows 1011 having positive polarity is equal to the total number of pixel rows 1011 having negative polarity, therefore it will not cause picture (or image) residual problem, avoiding horizontal crosstalk phenomenon occurring on the display panel 101 due to the two adjacent pixel rows 1011 not be able to compensate for each other on the capacitive coupling of the common electrode.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display device, wherein the display device comprises: a display panel, wherein the display panel comprises: a first number of pixel rows, wherein each one of the pixel rows comprises a second number of pixel units, and the first number is an odd number; a second number of scanning lines, wherein each one of the scanning lines is connected with a corresponding pixel unit of the first number of pixel rows; a first number of data lines, wherein the data lines are connected with the pixel units of each of the pixel rows; a driving circuit, wherein the driving circuit comprises: a scanning driver, wherein the scanning driver is connected with the second number of scanning lines, and the scanning driver generates scanning driving signals which are sent to the pixel units via the scanning lines; a data driver, wherein the data driver is connected with the first number of data lines, the data driver generates data driving signals which are sent to the pixel rows via the data lines, wherein during a predetermined timing circle, the data driver is configured to utilize a partial pixel rows reversed way for driving the display panel via the data driving signals, such that images are displayed frame by frame; wherein a portion of the pixel rows have a same polarity in adjacent frames of images on timeline; wherein the partial pixel rows reversed way means that a portion of the pixel rows have polarity reversed in adjacent frames on timeline, and a rest of the pixel rows on the same adjacent frames on timeline keep the polarity unchanged, wherein a number of frames of the image corresponding to the predetermined timing circle is defined as a third number; wherein the data driver is configured to equalize a total number of pixel rows having positive polarity to a total number of pixel rows having negative polarity using the data driving signals in the third number of the frames of the images.

2. The display device according to claim 1, wherein in any one frame of the images during the predetermined timing circle, a number of pixel rows having positive polarity is defined as a fourth number, and a number of pixel rows having negative polarity is defined as a fifth number; the fourth number is greater or equal to zero, and the fourth number is less than or equal to a sixth number plus one; the fifth number is greater or equal to the sixth number, and the fifth number is less than or equal to the first number; the first number is equal to the fourth number plus the fifth number; the third number is equal to the first number multiplied by 2 and plus 4; the sixth number is equal to the first number minus 1 then divided by 2; and the fourth number and the fifth number are defined as integers.

3. The display device according to claim 2, wherein during the predetermined timing circle, the data scanning driver generates a seventh number of normal frames of images, an auxiliary frame of image, and two compensation frames of images; wherein the seventh number is equal to the third number minus 3; wherein in the normal frames of images, the fourth number is equal to the sixth number plus 1, and the fifth number is equal to the sixth number; wherein in the auxiliary frame of image, the fourth number is equal to the sixth number, and the fifth number is equal to the sixth number plus 1; and wherein in the compensation frames of images, the fourth number is equal to zero, and the fifth number is equal to the first number.

4. A display device, wherein the display device comprises: a display panel, wherein the display panel comprises: a first number of pixel rows, wherein each one of the pixel rows comprises a second number of pixel units, and the first number is an odd number; a second number of scanning lines, wherein each scanning line is connected with a corresponding pixel unit of the first number of pixel rows; a first number of data lines, wherein the data lines are connected with the pixel units of each of the pixel rows; a driving circuit, wherein the driving circuit comprises: a scanning driver, wherein the scanning driver is connected with the second number of scanning lines, and the scanning driver generates scanning driving signals which are continually sent to the pixel units via the scanning lines; a data driver, wherein the data driver is connected with the first number of data lines, the data driver generates data driving signals which are sent to the pixel rows via the data lines, wherein during a predetermined timing circle, the data driver is configured to utilize a partial pixel rows reversed way for driving the display panel via the data driving signals, such that images are displayed frame by frame, wherein a number of frames of the image corresponding to the predetermined timing circle is defined as a third number; wherein the data driver is configured to equalize a total number of pixel rows having positive polarity to a total number of pixel rows having negative polarity using the data driving signals in the third number of the frames of the images.

5. The display device according to claim 4, wherein a portion of the pixel rows have a same polarity in adjacent frames of images on timeline.

6. The display device according to claim 4, wherein the partial pixel rows reversed way means that a portion of the pixel rows have polarity reversed in adjacent frames on timeline, and a rest of the pixel rows on the same adjacent frames on timeline keep the polarity unchanged.

7. The display device according to claim 4, wherein in any one frame of the images during the predetermined timing circle, a number of pixel rows having positive polarity is defined as a fourth number, and a number of pixel rows having negative polarity is defined as a fifth number; the fourth number is greater or equal to zero, and the fourth number is less than or equal to a sixth number plus one; the fifth number is greater or equal to the sixth number, and the fifth number is less than or equal to the first number; the first number is equal to the fourth number plus the fifth number; the third number is equal to the first number multiplied by 2 and plus 4; the sixth number is equal to the first number minus 1 then divided by 2; and the fourth number and the fifth number are defined as integers.

8. The display device according to claim 7, wherein during the predetermined timing circle, the data scanning driver generates a seventh number of normal frames of images, an auxiliary frame of image, and two compensation frames of images; wherein the seventh number is equal to the third number minus 3; wherein in the normal frames of images, the fourth number is equal to the sixth number plus 1, and the fifth number is equal to the sixth number; wherein in the auxiliary frame of image, the fourth number is equal to the sixth number, and the fifth number is equal to the sixth number plus 1; and wherein in the compensation frames of images, the fourth number is equal to zero, and the fifth number is equal to the first number.

9. The display device according to claim 8, wherein the auxiliary frame of image is set in the seventh number of normal frames of images, the two compensation frames of images are set after the seventh number of normal frames of images, and the two compensation frames of images are adjacent to each other on timeline.

10. The display device according to claim 9, wherein the normal frames of images are provided to the display panel for displaying.

11. A display method using the display device as claimed in claim 4, wherein the display method comprises the following steps: A. generating, by the scanning driver, scanning driving signals and sending the scanning driving signals to the pixel units via the scanning lines; B. generating, by the data driver, data driving signals and sending the data driving signals to the pixel rows via the data lines, wherein during a predetermined timing circle, the data driver is configured to utilize a partial pixel rows reversed way for driving the display panel via the data driving signals, such that images are displayed frame by frame.

12. The display method of the display device according to claim 11, wherein a portion of the pixel rows have a same polarity in adjacent frames of images on timeline.

13. The display method of the display device according to claim 11, wherein the partial pixel rows reversed way means that a portion of the pixel rows have polarity reversed in adjacent frames on timeline, and a rest of the pixel rows on the same adjacent frames on timeline keep the polarity unchanged.

14. The display method of the display device according to claim 11, wherein a number of frames of the image corresponding to the predetermined timing circle is defined as a third number; wherein the data driver is configured to equalize a total number of pixel rows having positive polarity to a total number of pixel rows having negative polarity using the data driving signals in the third number of the frames of the images.

15. The display method of the display device according to claim 14, wherein in any one frame of the images during the predetermined timing circle, a number of pixel rows having positive polarity is defined as a fourth number, and a number of pixel rows having negative polarity is defined as a fifth number; the fourth number is greater or equal to zero, and the fourth number is less than or equal to a sixth number plus one; the fifth number is greater or equal to the sixth number, and the fifth number is less than or equal to the first number; the first number is equal to the fourth number plus the fifth number; the third number is equal to the first number multiplied by 2 and plus 4; the sixth number is equal to the first number minus 1 then divided by 2; and the fourth number and the fifth number are defined as integers.

16. The display method of the display device according to claim 15, wherein during the predetermined timing circle, the data scanning driver generates a seventh number of normal frames of images, an auxiliary frame of image, and two compensation frames of images; wherein the seventh number is equal to the third number minus 3; wherein in the normal frames of images, the fourth number is equal to the sixth number plus 1, and the fifth number is equal to the sixth number; wherein in the auxiliary frame of image, the fourth number is equal to the sixth number, and the fifth number is equal to the sixth number plus 1; and wherein in the compensation frames of images, the fourth number is equal to zero, and the fifth number is equal to the first number.

17. The display method of the display device according to claim 16, wherein the auxiliary frame of image is set in the seventh number of normal frames of images, the two compensation frames of images are set after the seventh number of normal frames of images, and the two compensation frames of images are adjacent to each other on timeline.

18. The display method of the display device according to claim 16, wherein the normal frames of images are provided to the display panel for displaying.

* * * * *